(12) United States Patent
Middlebrooks et al.

(10) Patent No.: US 10,627,723 B2
(45) Date of Patent: Apr. 21, 2020

(54) YIELD ESTIMATION AND CONTROL

(71) Applicant: ASML Netherlands B.V., Veldhoven (NL)

(72) Inventors: Scott Anderson Middlebrooks, Veldhoven (NL); Willem Maria Julia Marcel Coene, Veldhoven (NL); Frank Arnoldus Johannes Maria Driessen, Veldhoven (NL); Adrianus Cornelis Matheus Koopman, Veldhoven (NL); Markus Gerardus Martinus Maria Van Kraaij, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 635 days.

(21) Appl. No.: 15/104,517

(22) PCT Filed: Nov. 14, 2014

(86) PCT No.: PCT/EP2014/074664
§ 371 (c)(1),
(2) Date: Jun. 14, 2016

(87) PCT Pub. No.: WO2015/090774
PCT Pub. Date: Jun. 25, 2015

(65) Prior Publication Data
US 2016/0313651 A1 Oct. 27, 2016

Related U.S. Application Data

(60) Provisional application No. 61/917,305, filed on Dec. 17, 2013.

(51) Int. Cl.
*G01V 3/18* (2006.01)
*G03F 7/20* (2006.01)
(Continued)

(52) U.S. Cl.
CPC .......... *G03F 7/70525* (2013.01); *G03F 7/705* (2013.01); *G06F 17/5036* (2013.01); *G06N 7/005* (2013.01); *G06N 20/00* (2019.01)

(58) Field of Classification Search
CPC ..... G03F 7/70525; G03F 7/705; G06N 20/00; G06N 99/005; G06F 17/5036
(Continued)

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| CN | 102436149 | 5/2012 |
| KR | 10-2013-0092485 | 8/2013 |

(Continued)

OTHER PUBLICATIONS

International Search Report and Written Opinion dated Feb. 16, 2015 in corresponding International Patent Application No. PCT/EP2014/074644.

(Continued)

*Primary Examiner* — Huan Hoang
(74) *Attorney, Agent, or Firm* — Pillsbury Winthrop Shaw Pittman LLP

(57) ABSTRACT

A defect prediction method for a device manufacturing process involving production substrates processed by a lithographic apparatus, the method including training a classification model using a training set including measured or determined values of a process parameter associated with the production substrates processed by the device manufacturing process and an indication regarding existence of defects associated with the production substrates processed in the device manufacturing process under the values of the (Continued)

process parameter, and producing an output from the classification model that indicates a prediction of a defect for a substrate.

26 Claims, 13 Drawing Sheets

(51) Int. Cl.
*G06N 20/00* (2019.01)
*G06F 17/50* (2006.01)
*G06N 7/00* (2006.01)

(58) Field of Classification Search
USPC .......................................................... 706/12
See application file for complete search history.

(56) References Cited

U.S. PATENT DOCUMENTS

| | | | |
|---|---|---|---|
| 5,523,193 A | 6/1996 | Nelson | |
| 5,969,441 A | 10/1999 | Loopstra et al. | |
| 6,603,529 B1* | 8/2003 | Finarov | G03F 7/3028 |
| | | | 355/27 |
| 7,003,758 B2 | 2/2006 | Ye et al. | |
| 7,062,081 B2 | 6/2006 | Shimoda et al. | |
| 7,512,508 B2 | 3/2009 | Rajski et al. | |
| 7,587,704 B2 | 9/2009 | Ye et al. | |
| 7,729,528 B2* | 6/2010 | O'Dell | G01N 21/9501 |
| | | | 250/559.39 |
| 7,937,179 B2 | 5/2011 | Shimshi et al. | |
| 8,464,194 B1 | 6/2013 | Agarwal et al. | |
| 2005/0076322 A1 | 4/2005 | Ye et al. | |
| 2009/0157630 A1 | 6/2009 | Yuan | |
| 2010/0315614 A1 | 12/2010 | Hansen | |
| 2011/0188734 A1* | 8/2011 | Tsuchiya | G06T 7/0002 |
| | | | 382/149 |
| 2012/0078891 A1* | 3/2012 | Brown | F16H 1/28 |
| | | | 707/723 |
| 2013/0212543 A1 | 8/2013 | Crouse et al. | |
| 2013/0279795 A1 | 10/2013 | Shlain et al. | |
| 2014/0002632 A1 | 1/2014 | Lin | |
| 2014/0303912 A1 | 10/2014 | Banerjee et al. | |
| 2015/0066467 A1* | 3/2015 | Acar | G06F 17/5036 |
| | | | 703/14 |
| 2015/0120216 A1* | 4/2015 | Vukkadala | G01N 19/08 |
| | | | 702/35 |
| 2015/0227654 A1 | 8/2015 | Hunsche et al. | |

FOREIGN PATENT DOCUMENTS

| | | |
|---|---|---|
| WO | 2010/059954 | 5/2010 |
| WO | 2013/035421 | 3/2013 |
| WO | 2014/131262 | 9/2014 |

OTHER PUBLICATIONS

Duo Ding et al., "High Performance Lithography Hotspot Detection with Successively Refined Pattern Identifications and Machine Learning," IEEE Transactions on Computer-Aided Design of Integrated Circuits and Systems, vol. 30, No. 11, pp. 1361-1634 (Nov. 2011).

Duo Ding et al., "EPIC: Efficient Prediction of IC Manufacturing Hotspots with a Unified Meta-Classification Formulation," 17th Annual Asia and South Pacific Design Automation Conference (ASPDAC), Sydney, Australia, 8 pages (Jan. 30-Feb. 2, 2012).

Jhih-Rong Gao et al., "Accurate Lithography Hotspot Detection based on PCA-SVM Classifier with Hierarchical Data Clustering," Proc. SPIE, vol. 9053, pp. 90530E-1-90530E-10.

Duo Ding et al., "Machine Learning based Lithographic Hotspot Detection with Critical-Feature Extraction and Classification," IEEE International Conference on IC Design and Technology, pp. 219-222 (May 18, 2009).

Chris Spence, "Full-Chip Lithography Simulation and Design Analysis—How OPC Is Changing IC Design," Proc. SPIE, vol. 5751, pp. 1-14 (2005).

Yu Cao et al., "Optimized Hardware and Software for Fast, Full Chip Simulation," Proc. SPIE, vol. 5754, pp. 407-414 (2005).

Alan E. Rosenbluth et al., "Optimum mask and source patterns to print a given shape," J. Microlith., Microfab., Microsyst, vol. 1, No. 1, pp. 13-30 (Apr. 2002).

Yuri Granik, "Source optimization for image fidelity and throughput," J. Microlith., Microfab., Microsyst, vol. 3, No. 4, pp. 509-522 (Oct. 2004).

Chinese Office Action dated Feb. 4, 2017 in corresponding Chinese Patent Application No. 201480068175.4.

\* cited by examiner

YIELD ESTIMATION AND CONTROL

CROSS-REFERENCE TO RELATED APPLICATIONS

This application is the U.S. national phase entry of PCT patent application no. PCT/EP2014/074664, which was filed on Nov. 14, 2014, which claims the benefit of priority of U.S. provisional application No. 61/917,305, which was filed on Dec. 17, 2013 and which is incorporated herein in its entirety by reference.

TECHNICAL FIELD

The description herein relates to lithographic apparatuses and processes, and more particularly to a tool to predict and correct defects so as to increase the yield.

BACKGROUND

A lithographic apparatus can be used, for example, in the manufacture of integrated circuits (ICs) or other devices. In such a case, a patterning device (e.g., a mask) may contain or provide a circuit pattern corresponding to an individual layer of the device ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic apparatus, one target portion at a time. In one type of lithographic apparatus, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively.

Prior to the device fabrication procedure of transferring the circuit pattern from the patterning device to the substrate of the device manufacturing process, the substrate may undergo various device fabrication procedures of the device manufacturing process, such as priming, resist coating and a soft bake. After exposure, the substrate may be subjected to other device fabrication procedures of the device manufacturing process, such as a post-exposure bake (PEB), development, and a hard bake. This array of device fabrication procedures is used as a basis to make an individual layer of a device, e.g., an IC. The substrate may then undergo various device fabrication procedures of the device manufacturing process such as etching, ion-implantation (doping), metallization, oxidation, chemo-mechanical polishing, etc., all intended to finish off the individual layer of the device. If several layers are required in the device, then the whole process, or a variant thereof, is repeated for each layer. Eventually, a device will be present in each target portion on the substrate. If there is a plurality of devices, these devices are then separated from one another by a technique such as dicing or sawing, whence the individual devices can be mounted on a carrier, connected to pins, etc.

SUMMARY

Disclosed herein is a computer-implemented defect prediction method for a device manufacturing process involving production substrates processed by a lithographic apparatus, the method comprising:

training a classification model using a training set comprising measured or determined values of a process parameter associated with the production substrates processed by the device manufacturing process and an indication regarding existence of defects associated with the production substrates processed in the device manufacturing process under the values of the process parameter; and producing an output from the classification model that indicates a prediction of a defect for a substrate.

Disclosed herein is a method of training a classification model, the method comprising:

predicting a defect in or on a substrate using the classification model, the classification model having, as an independent variable, a process parameter of a device manufacturing process for lithographically exposed substrates and/or a layout parameter of a pattern to be provided on a substrate using a lithographic apparatus;

receiving information regarding existence of a defect for a measured or determined value of the process parameter and/or layout parameter; and training the classification model based on the predicted defect and the information regarding existence of the defect for the measured or determined value of the process parameter and/or layout parameter.

Disclosed herein is a computer-implemented method of producing a classification model to facilitate defect prediction in a device manufacturing process involving production substrates processed by a lithographic apparatus, the method comprising training the classification model using a training set comprising measured or determined values of a process parameter of a plurality of substrates processed by the device manufacturing process and an indication regarding existence of defects associated with the values of the process parameter.

Disclosed herein is a computer program product comprising a computer readable medium having instructions recorded thereon, the instructions when executed by a computer implementing a method as described herein.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting an apparatus, e.g., a lithographic projection apparatus, such that device fabrication results and/or processes (e.g., of lithography) have one or more desirable characteristics, such as higher accuracy of projection of a design layout on a substrate, larger process window, etc.

Figure 1:
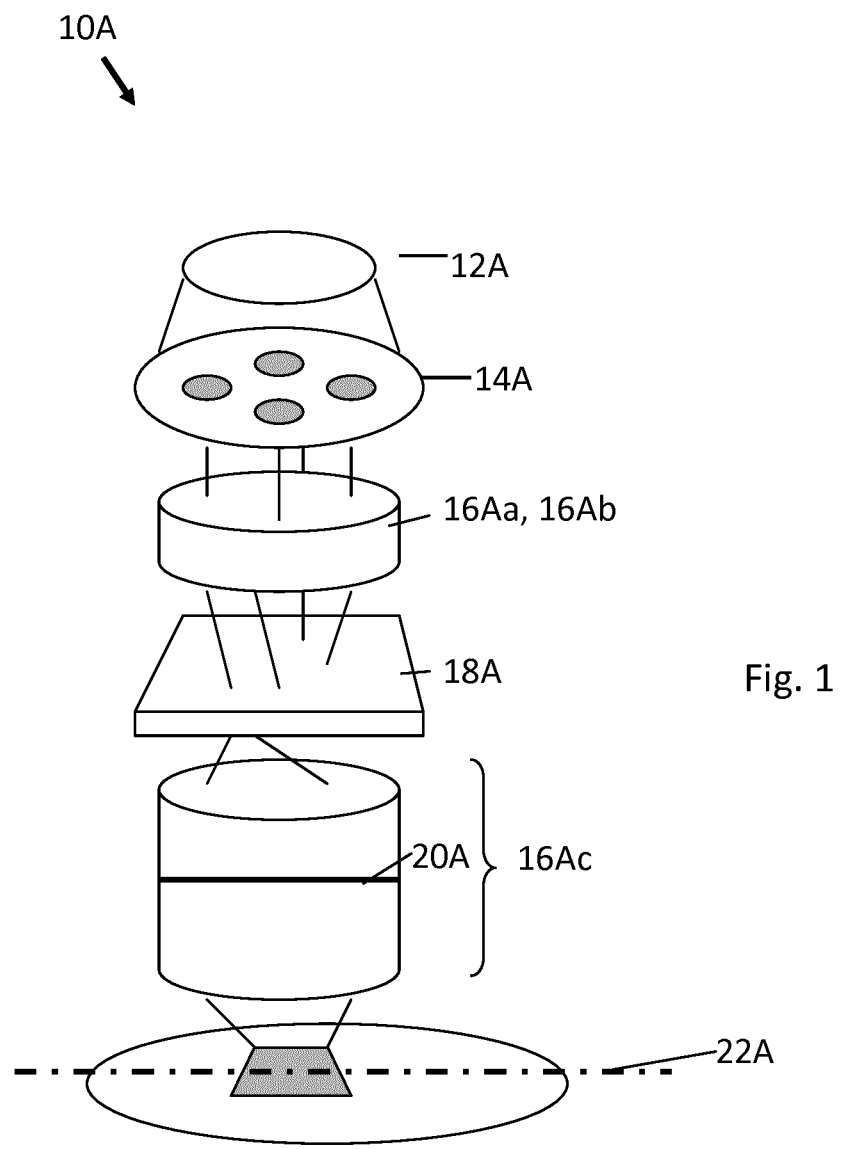
FIG. 1 is a block diagram of various subsystems of a lithography system.

As a brief introduction, FIG. 1 illustrates an exemplary lithographic projection apparatus 10A. Major components include illumination optics which define the partial coherence (denoted as sigma) and which may include optics 14A, 16Aa and 16Ab that shape radiation from a radiation source 12A, which may be a deep-ultraviolet excimer laser source or other type of source including an extreme ultra violet (EUV) source (as discussed herein, the lithographic projection apparatus itself need not have the radiation source); and optics 16Ac that project an image of a patterning device pattern of a patterning device 18A onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=\sin(\Theta_{max})$.

In a lithographic projection apparatus, projection optics direct and shape the illumination from a source via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes which occur during exposure, post-exposure bake (PEB) and development). Optical properties of the lithographic projection apparatus (e.g., properties of the source, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics.

Figure 13:
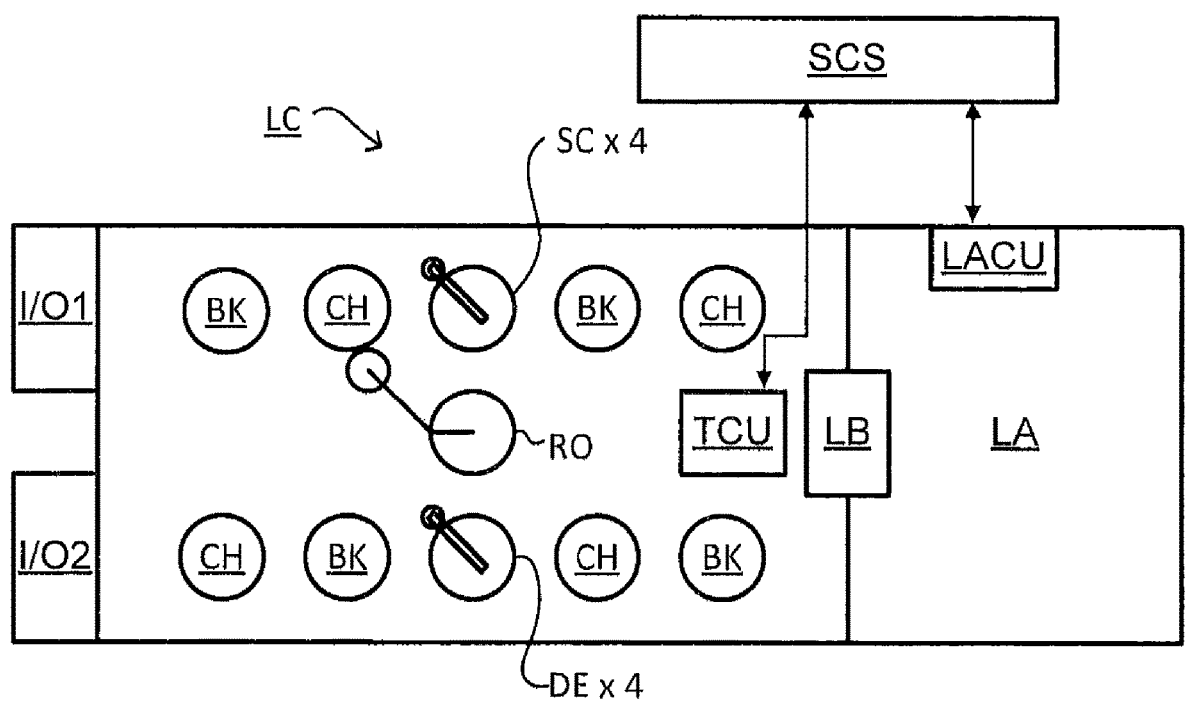
FIG. 13 schematically depicts an embodiment of a lithographic cell or cluster.

As shown in FIG. 13, the lithographic apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency. The lithographic cell LC may further comprises one or more etchers to etch the substrate and one or more measuring devices configured to measure a parameter of the substrate. The measuring device may comprise an optical measurement device configured to measure a physical parameter of the substrate, such as a scatterometer, a scanning electron microscope, etc. The measuring device may be incorporated in the lithographic apparatus LA. An embodiment of the invention may be implemented in or with the supervisory control system SCS and/or the lithographic control unit LACU. For example, data from the supervisory control system SCS and/or the lithographic control unit LACU may be used by an embodiment of the invention and one or more signals from an embodiment of the invention may be provided to the supervisory control system SCS and/or the lithographic control unit LACU.

Figure 2:
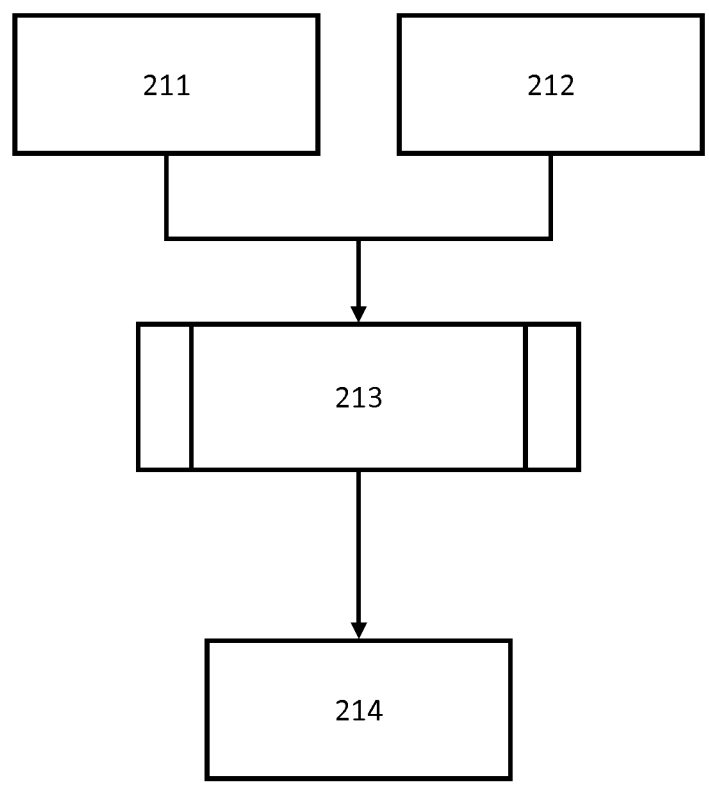
FIG. 2 schematically depicts a method of predicting defects in a device manufacturing process.

FIG. 2 schematically depicts a method of predicting defects in a device manufacturing process. A defect can be a systematic defect such as necking, line pull back, line thinning, CD, overlapping and bridging; a defect can also be a random defect such as one caused by deposition of a particle such as a dust particle. A systematic defect can be predicted and controlled. A defect can be in a resist image, an optical image or an etch image (i.e., a pattern transferred to a layer of the substrate by etching using the resist thereon as a mask). A computational or an empirical model 213 can be used to predict (e.g., predict the existence, locations, types, shapes, etc. of) defects 214. The model 213 can take into account parameters 211 (also referred to as process parameters) of the device manufacturing process and/or layout parameters 212. The process parameters 211 are parameters associated with the device manufacturing process but not with the layout. For example, the process parameters 211 may include a characteristic of the source (e.g., intensity, pupil profile, etc.), a characteristic of the projection optics, dose, focus, a characteristic of the resist, a characteristic of development of the resist, a characteristic of post-exposure baking of the resist, and/or a characteristic of etching. The layout parameters 212 may include shapes, sizes, relative locations, and absolute locations of various features on a layout, and also overlapping of features on different layouts. The model 213 may be a fixed model, i.e., the model itself does not change with its input such as the process parameters 211 and the layout parameters 212. Namely, an outcome of a fixed model is always the same under the same input. In an empirical model, the image (e.g., resist image, optical image, etch image) is not simulated; instead, the empirical model predicts defects based on correlations between the input and the defects. In a computational model, a portion or a characteristic of the image is calculated, and defects are identified based on the portion or the characteristic. For example, a line pull back defect may be identified by finding a line end too far away from its desired location; a bridging defect may be identified by finding a location where two lines undesirably join.

Figure 3:
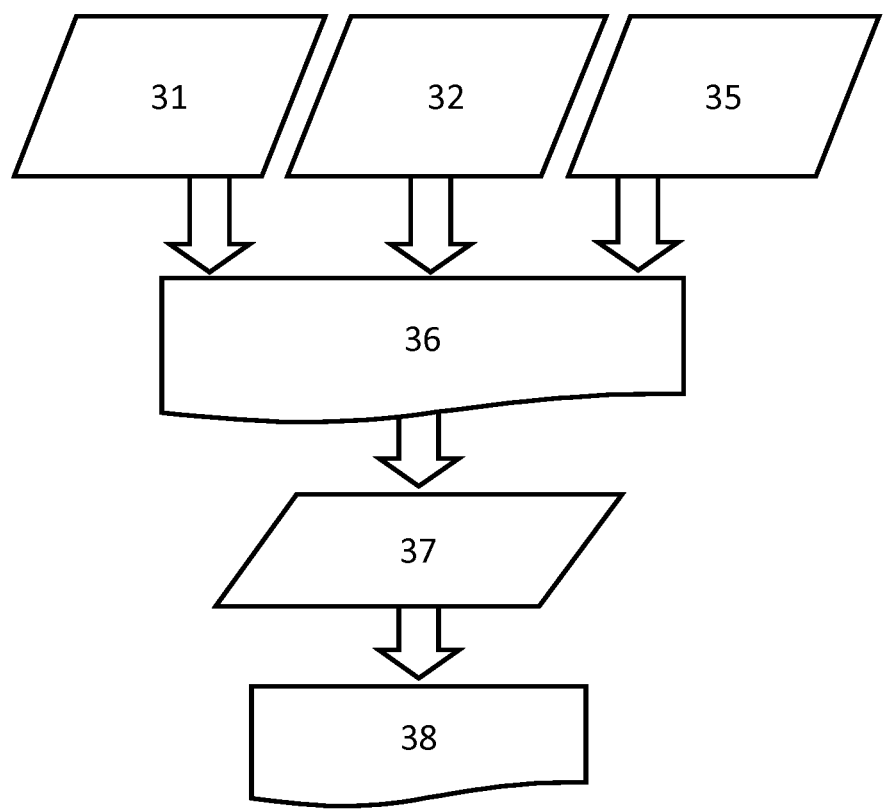
FIG. 3 is a block diagram of simulation models.

FIG. 3 illustrates an exemplary computational model. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout) of a design layout, which is the representation of an arrangement of features on or formed by a patterning device. An aerial image 36 can be simulated from the source model 31, the projection optics model 32 and the design layout model 35. A resist and/or etch image 38 can be simulated from the aerial image 36 using a resist and/or etch model 37. Simulation of lithography can, for example, predict contours and/or CDs in an image.

More specifically, it is noted that the source model 31 can represent the optical characteristics of the source that include, but not limited to, sigma ($\sigma$) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

Figure 4:
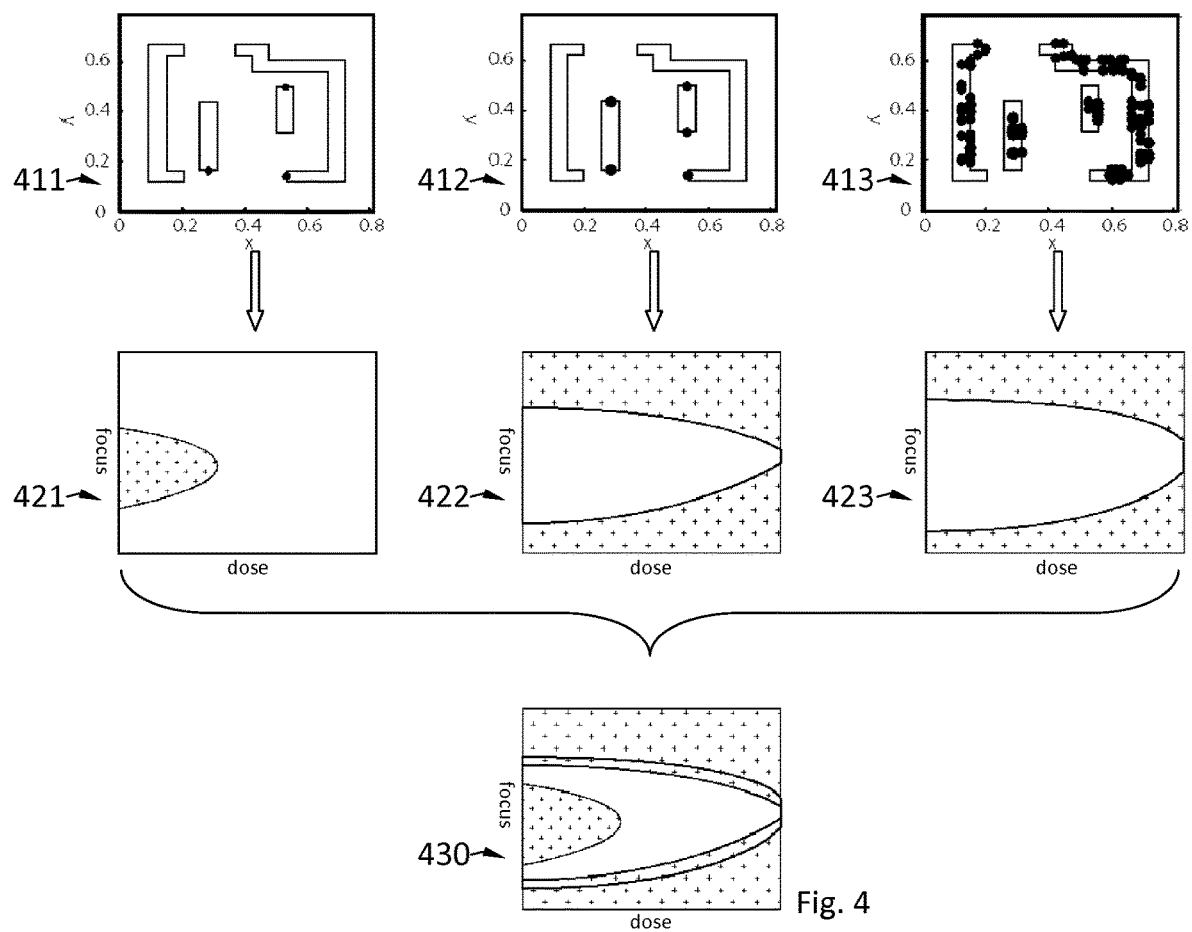
FIG. 4 schematically shows prediction of a process window of a layout.

FIG. 4 schematically shows prediction of a process window of a layout (i.e., a space of process parameters under which the layout is substantially free of systematic defects). Sub-process windows 421-423 (depicted as the unhatched areas) may be predicted using a model (empirical or computational) for features in a layout with respect to different types of defects of the layout 411-413 (e.g., line pull back, CD, necking, etc.). For example, a process in the sub-process window 421 does not produce line pull back defects among these features. The sub-process windows of all features, and for all types of defects, may be merged to form the process window 430 of the layout.

Figure 5:
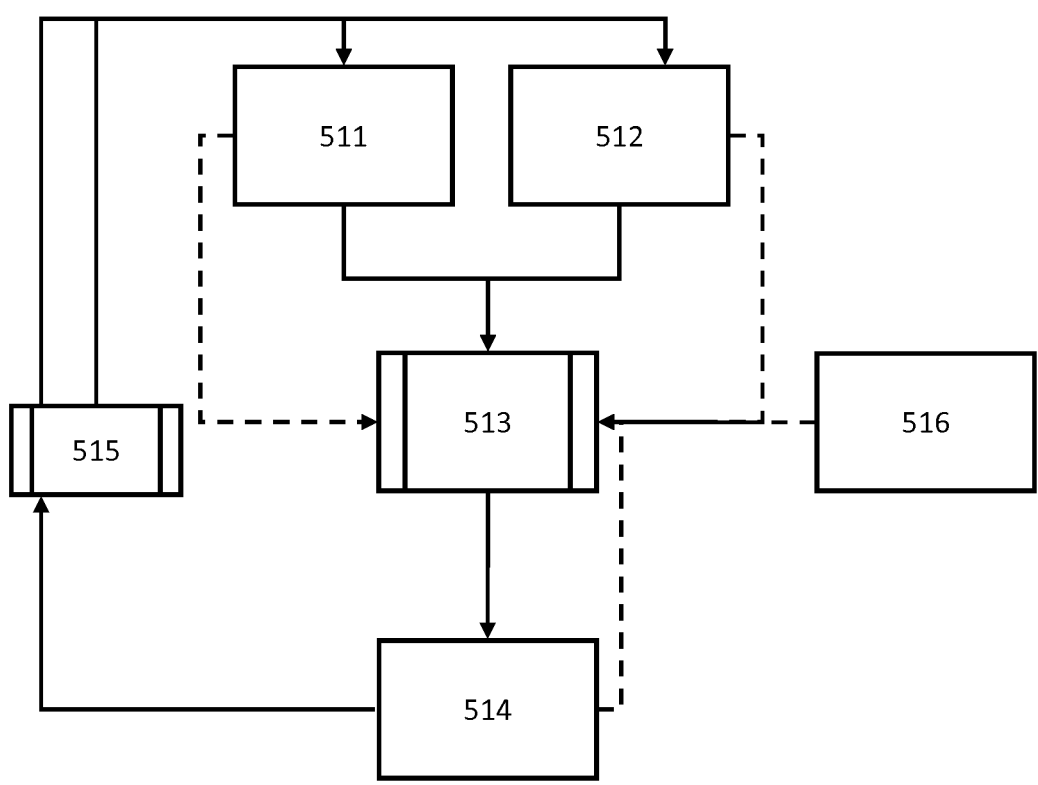
FIG. 5 schematically depicts a method of predicting defects in a device manufacturing process, according to an embodiment.

FIG. 5 schematically depicts a method of predicting defects in a device manufacturing process, according to an embodiment. A classification model (also known as a classifier) 513 can be used to predict (e.g., predict the existence, locations, types, shapes, etc. of) defects 514. The model 513 can take account of process parameters 511 and/or layout parameters 512. The process parameters 511 are parameters associated with the device manufacturing process but not with the layout. For example, the process parameters 511 may include a characteristic of the source (e.g., intensity, pupil profile, etc.), a characteristic of the projection optics, dose, focus, a characteristic of the resist, a characteristic of development of the resist, a characteristic of post-exposure baking of the resist and/or a characteristic of etching. The layout parameters 512 may include shapes, sizes, relative locations, and absolute locations of various features on a layout, and also overlapping of features on different layouts.

The term "classifier" or "classification model" sometimes refers to a mathematical function, implemented by a classification algorithm, that maps input data to a category. In machine learning and statistics, classification is the problem of identifying to which of a set of categories (sub-populations) a new observation belongs, on the basis of a training set of data containing observations (or instances) whose category membership is known. The individual observations are analyzed into a set of quantifiable properties, known as various explanatory variables, features, etc. These properties may variously be categorical (e.g. "good"—a process that does not produce defects or "bad"—a process that produces defects). Classification is considered an instance of supervised learning, i.e. learning where a training set of correctly identified observations is available.

Terminology across fields is quite varied. In statistics, where classification may be done with logistic regression or a similar procedure, the properties of observations are termed explanatory variables (or independent variables, regressors, etc.), and the categories to be predicted are known as outcomes, which are considered to be possible values of the dependent variable. In machine learning, the observations are often known as instances, the explanatory variables are termed features (grouped into a feature vector), and the possible categories to be predicted are classes.

A classification model may be phrased in terms of a linear function that assigns a score to each possible category k by combining the feature vector of an instance with a vector of weights, using a dot product. The predicted category is the one with the highest score. This type of score function is known as a linear predictor function and has the following general form: $\text{score}(X_i, k) = \beta_k \cdot X_i$, where $X_i$ is the feature vector for instance i, $\beta_k$ is the vector of weights corresponding to category k, and $\text{score}(X_i, k)$ is the score associated with assigning instance i to category k. Models with this basic setup are known as linear classifiers. Examples of such algorithms are logistic regression, multinomial logit, probit regression, the perceptron algorithm, support vector machines, import vector machines and/or linear discriminant analysis.

In an embodiment, the classification model 513 involves logistic regression. In the context of this embodiment, the dependent variable is binary—that is, the number of available categories is two—e.g., "good" or "bad." However, the number of available categories is certainly not limited to two.

Logistic regression measures the relationship between a categorical dependent variable and one or more independent variables, which are usually (but not necessarily) continuous, by using probability as the predicted values of the dependent variable. The classification model 513 may be trained using a training set of data containing one or more process and/or layout parameters and whether the process and/or layout parameters produce defects (i.e., "bad") or not (i.e., "good"). An initial training set may be obtained from one or more test runs of a layout under a range of values of the parameters.

In an embodiment, the classification model 513 involves kernel logistic regression, especially when the score function cannot be expressed in the linear form of score($X_i$, k)=$\beta_k \cdot X_i$, where $X_i$ is the feature vector for instance i, $\beta_k$ is the vector of weights corresponding to category k, and score($X_i$, k) is the score associated with assigning instance i to category k. A kernel may first be used to project the independent variables (e.g., process parameters) into another parameter space: $\Phi$: X→Y, so that score($X_i$,k)=$\beta_k \cdot Y_i$, where $Y_i$=$\Phi(X_i)$.

The method illustrated in FIG. 5 may further include a correction step 515, in which one or more process parameters 511, one or more layout parameters 512, or both, may be adjusted to reduce or eliminate the defects.

In an embodiment, the model 513 is not a fixed model. Instead, the model 513 may be refined with data 516 from metrology, yield data (e.g., identification of defects by a measurement tool such as an electronic microscope, by electrical testing, etc.) or other data, from a user of the lithographic apparatus, or from another model (e.g., another empirical model or computational model). The model 513 may be refined after exposure of one or more dies and/or one or more substrates using further data.

The data 516 may include measured or determined values of a process parameter associated with a plurality of production substrates processed by the device manufacturing process. Production substrates are substrates having one or more devices in one or more stages of production. For example, the production substrates may be substrates having a resist image for one or more devices. Values of a process parameter for such substrates may include data from the lithographic apparatus (e.g., apparatus settings and/or lithographic apparatus sensor data) and/or metrology data (e.g., provided by a dedicated optical measuring device to measure physical parameters of the resist image). As another example, the production substrates may be substrates having etched features and/or features with functioning devices. Values of a process parameter for such substrates may include data from an etch tool (e.g., etch tool settings and/or etch tool sensor data), metrology data (e.g., provided by a scanning electron microscope) and/or yield data (e.g., defect analysis from a measuring tool comparing a produced device against the expected device, electrical testing of devices, etc.). Further, the device manufacturing process may involve the entire process from substrate to device or a portion thereof. For example, the device manufacturing process may be the lithographic patterning process only or in combination with another device manufacturing procedures. In an embodiment, the device manufacturing process may be the etch process only or in combination with another device manufacturing procedure. In the etch circumstance, the device manufacturing process involves a lithographic apparatus because the substrates processed by the etch apparatus were patterned by a lithographic patterning procedure involving a lithographic apparatus.

In an embodiment, there is provided an indication regarding existence of defects associated with the production substrates processed in the device manufacturing process under the values of the process parameter. Thus, in an embodiment, each of the measured or determined values of a process parameter is associated with an indication regarding existence of a defect. For example, the indication regarding existence of defects may be any label to signify the existence or absence of a defect. For example, the label may be "good" and/or "bad". The label may be applied by a user or determined automatically using an applicable tool. For example, electronic testing of a substrate may identify a defect in a device and label the device "good" or "bad". That tested substrate is associated with a value of a process parameter. In an example, if the yield is below a certain threshold, the associated values of the process parameter 511 and/or layout parameter 512 may be labeled/categorized as "bad." The combination of the value of the process parameter (e.g., dose and focus) and the label is used to train the model 513.

Data from metrology may be obtained from an optical measuring tool (e.g., a tool to measure diffracted radiation from a metrology target and/or from the exposed area), an electron microscope, or other suitable inspection tool and may be data measured by a sensor in a lithographic apparatus, such as level sensor or alignment data.

In an embodiment, refinement of the model 513 may include training with a training set including a new observation of one or more process parameters or both process and layout parameters used in the exposure of the one or more dies and/or one or more substrates and the data from metrology, yield data or other data, from a user of the lithographic apparatus, or from another model. The training set used for refining the model 513 may not necessarily include all the data previously used to train the model 513. For example, if the model 513 is initially trained with a data set including 100 observations, this training set may include 99 of the 100 observations and the new observation. This approach may limit the size of the training set so as to limit the computational cost of the training. One or more algorithms may be used to manage, or continuously manage, the size of the data set. For example, import vector machine or support vector machine may be used to manage the size of the data set.

Figure 6:
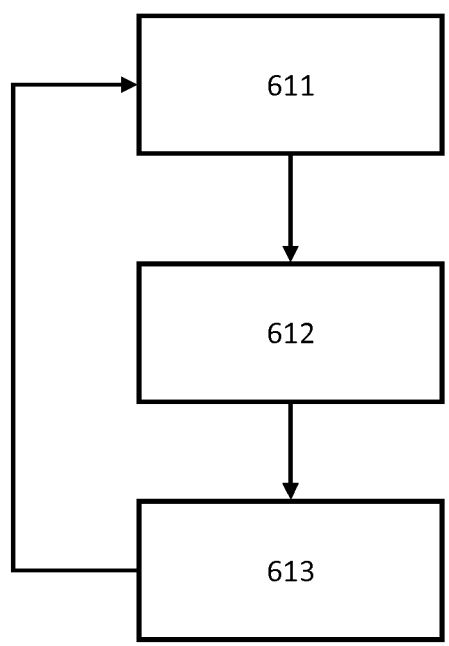
FIG. 6 schematically depicts a method of retraining a classification model.

FIG. 6 schematically depicts a method of training a classification model such as the model 513. In step 611, a defect of a device, e.g., in a resist or optical image of the device, is predicted using the classification model with one or more process and/or layout parameters used to form the device as independent variables of the classification model. In step 612, the device, e.g., the resist or optical image is simulated, using another model (e.g., empirical or computational) or measured, e.g., the resist image or the etched pattern, using a suitable inspection tool and the existence, shapes, types, and/or locations of defects is determined. In step 613, the model is trained based on the prediction and the existence of defects as determined from the simulation or measurement.

Figure 7:
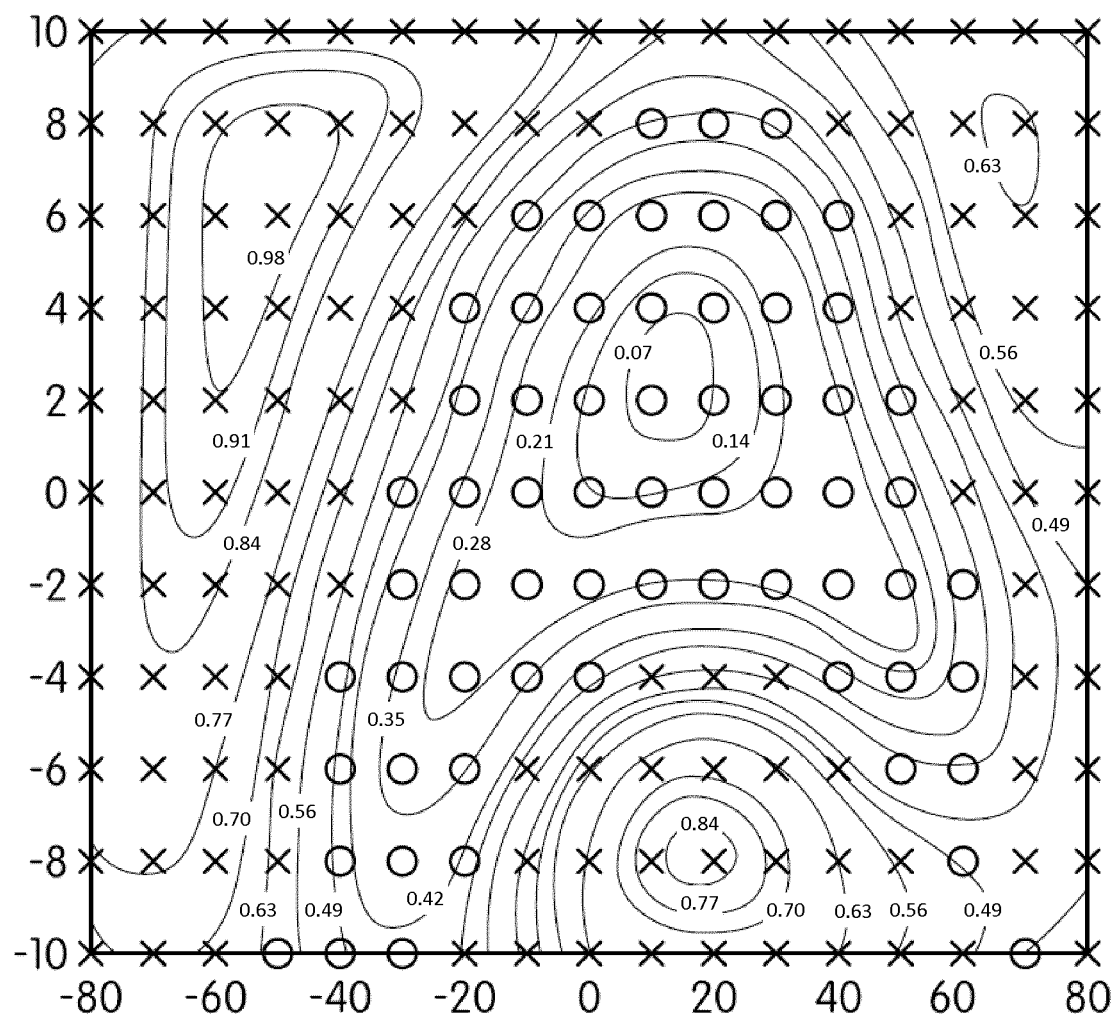
FIG. 7 shows an exemplary classification model as trained by a training set.

FIG. 7 shows an exemplary output of a classification model as trained by a training set including 187 observations containing pairs of focus (vertical axis) and dose (horizontal axis) as the process parameters and whether the pairs of focus and dose produce defects ("O" means no defect, e.g., "good"; "X" means defect, e.g., "bad"). The probability of a defect is determined by the model after training and shown in the output of FIG. 7 as an isopleth map with probabilities associated with the contour lines. As will be appreciated, the output of the model can be in other forms such as a color or gray scale or a table of results. The output of the model matches reasonably well with the training set.

Thus, in an embodiment, there is provided in-line learning of a device manufacturing process involving a lithographic apparatus. That is, a classification model is produced that is continually or regularly trained with new measured or determined values of one or more process parameters (e.g., dose and/or focus) associated with production substrates and an indication of a defect associated with such one or more process parameters. Thus, in an embodiment, a model specific to a lithographic apparatus and/or a device manufacturing process is produced that evolves over time with the use of the lithographic apparatus and/or processing of substrates using the device manufacturing process. Thus, in an embodiment, empirical data is used to generate, and subsequently shape, a model that represents a device manufacturing process (e.g., a particular device manufacturing process using a particular patterning device layout).

Due to the empirical data, little data interpretation may be required. For example, such a process may directly use a pupil intensity map of a metrology tool in training the classification model, rather than interpreting such an intensity map to extract structures and edge slopes and then using the data to improve a model. For example, learning techniques can correlate the possibility of an existence of a defect from the pupil intensity map based on the already learned model and so the data from the pupil intensity map can help affirm the existence (or not) of a defect. Thus, in an embodiment, such data need not have an associated label per se but nevertheless may be used to increase the ability of the model to predict whether a defect will occur or not. For example, the pupil intensity map may indicate a feature having a parameter value out of line with adjacent values of the parameter. While not necessarily confirming of a defect, such information may be used to train the model to help affirm or deny an existing correlation in the model regarding that feature and defect probability. In an embodiment, measurements are of device layouts using, e.g., a measurement pupil of an optical measuring tool. So, special structures (e.g., metrology targets) may not be necessary; any structure may do, such as the device layout structures (for example, SRAM cell-blocks in logic/MPU devices).

In an embodiment, operator knowledge/experience may be used an input to the formation of the classifier model. Operator feedback may steer the predictability of the model. For example, the user may add more predictive features into the classification algorithm.

In an embodiment, the classifier model can generate a probability of a defect given specific measured or determined features. And, the accuracy of the prediction increases with time and with more measurements as the classifier model becomes more "experienced". This in-line learning is distinguished from so-called data mining, which is typically used to review why things went wrong. In an embodiment, the in-line data is used to generate, and subsequently update, a model that can predict the probability of a defect occurring as the process is running. Thus, the output of the model may provide an indicator of what to check and which substrate dies to measure to see if all goes well—and thus to improve the overall yield.

In an embodiment, the device manufacturing process may be controlled using the classifier model. The in-line learning allows for tracking of the process (e.g., drift) and allows for tuning (controlling) of the process. For example, one or parameters of the lithographic apparatus may be controlled based on the output of the classifier model, whether automatically or after user evaluation. For example, the focus and/or dose of a lithographic projection apparatus may be controlled based on the output.

In an embodiment, the classifier model incorporates measurements across a substrate (e.g., not merely intrafield data). Thus, the measurements may data through focus, as the local substrate differences may be relatively large. Thus, through relying on measurements from a plurality of different substrate, it is possible to measure at a specific dose, completely through focus without the need for generating separate exposures.

In an embodiment, while the discussion has focused on lithographic parameters such focus and dose, the learning paradigm may be readily extended to other processes, such as etch. For instance, the relationship between etch features and yield may be learned, which may also be observed with in-line metrology data.

Thus, in an embodiment, there is provided a learning classifier model that can predict a defect and estimate its probability. Moreover, in an embodiment, the learning classifier is not static and is continuously updated and improved by measured or determined data during the device manufacturing process. Moreover, the classifier model can be extended in its coverage by feeding it data which is not related to lithography such as layer-thickness variations, post-etch data, operator defect decisions, etc., which further enhance the "experience" of the model.

In an embodiment, the classifier model enables improvement of the estimation of a probability of a defect for non-measured data points. For example, one may be interested in a prediction of a defect at site A and B on a substrate or a pattern layout. The classifier model enables prediction of the occurrence of a defect at site A and B. Then, a measurement that adds information (e.g., metrology data (without or with label data), yield data, etc.) associated with site A may be used to further train the classifier model. Now, an estimate of the probability of a defect at site A and B can be determined, without having to measure at site B.

In an embodiment, the classifier model vectors may include various types of information. So, for example, the classifier model may include data regarding the probability of a defect for a particular dose and focus combination but also include data regarding what one or more apparatuses are associated with that data point, what pattern layout is associated with that data point, what etch type was used, etc. So, in an embodiment, a classifier model may be trained on limited and specific data (e.g., merely dose and focus information and an associated label) or trained on comprehensive data or some variant in between. So, from a more comprehensive model, a "submodel" may be defined from the model that is focused on a particular apparatus (e.g., lithographic apparatus), on a particular layout, etc. Thus, a user may employ a particular model or "submodel", whether, e.g., for analysis or for process control, as desired that focuses on the user's needs or desires.

In an embodiment, the training of the classifier model decides if new training data (e.g., measured data points) add enough information to be included in the model. Adding this new information is balanced with increasing the size of the model, so that the model won't grow without bound.

In an embodiment, the classifier model can provide on an on-product printability prediction. For example, the classifier model can quantify the probability of a defect. The classifier model may provide full substrate predictions. The classifier model may predict a number of defects. The classifier model may predict yield of good die. The classifier model may provide a location of the defect.

In an embodiment, the training data for the classifier model may be sampled for each substrate of a lot produced by a device manufacturing process. The training device data may sampled for each device on a substrate of, e.g., a lot of substrates. The training data may be sampled for each layer on a substrate. In an embodiment, the training data comprises measurement data and measurement locations may be in-die, from outside of the die (e.g., scribe line metrology targets) and/or across the substrate. In-die measurements may be sampled based on a simulation result of hotspots, location of particular device structures (e.g., SRAM and other locations), and/or be device (e.g., IC) dependent.

In an embodiment, new training data is continually supplied (e.g., during device manufacturing, during the process of a plurality of lots of substrates, etc.) and thus prediction quality is continually updated.

In an embodiment, output of the classifier model may be provided to a yield management system of a fab to improve device yield.

So, in an embodiment, the values of one or more process parameters and/or layout parameters are statistically correlated by machine learning to full-substrate, on-product yield sensitivities. Thus, for example, defects may be predicted for particular parts of a die and/or particular parts of a substrate. Further, the defects may be predicted for actual production based on actual production data. Thus, the machine learning model may be specific to actual process conditions (including, for example, their drift) and enable enhanced prediction compared to prediction based merely on a theoretical model using pattern layout data.

Thus, in an embodiment, there is provided a comprehensive defect inspection and yield prediction system in which in-line and on-product parameter values from, e.g., a metrology tool measuring production substrates, are used to infer printability defects. The system utilizes artificial intelligence techniques to predict printability of systematic, layout-specific defects. It extends hotspot prediction from single-die to full-substrate, including the edge-of-substrate region. In an embodiment, the system may measure each substrate in a lot using a metrology tool. The system may augment or replace current defect-inspection methods (e.g., scanning electron microscopes). The output of the system may include a performance indicator within the fab's yield management system to predict and/or improve final device yield. The system may generate customized lithograph apparatus or other apparatus recipes and files to (automatically) improve yield in subsequent lots (or substrates) of, e.g., the same device and/or layer. The system may enable continual estimation and tracking of defects and continually improve model prediction accuracy. Occurrence of defects may be reduced or minimized via regulation (e.g., closed-loop control).

An advantage of the described embodiments herein may include faster yield ramping, more efficient SEM review, historical analysis and/or control.

Figure 8:
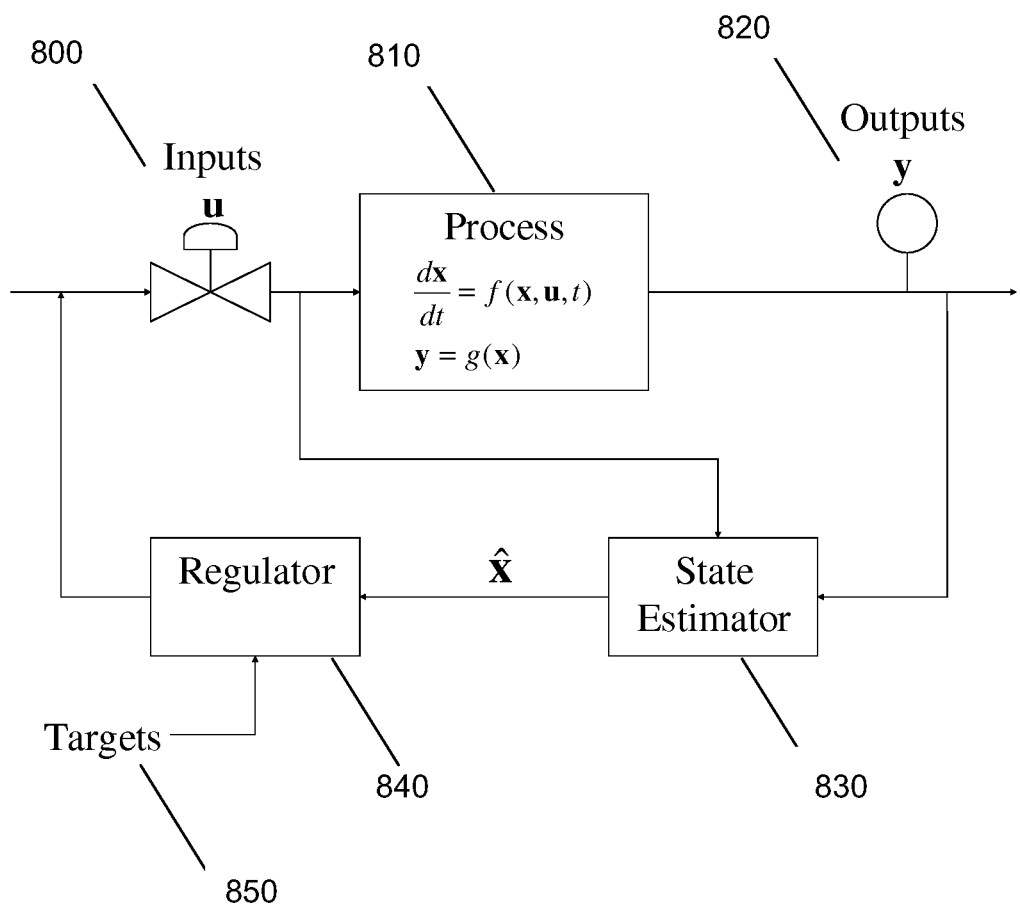
FIG. 8 is a block diagram of an example computer system.

FIG. 8 is block diagram of a model predictive control system according to an embodiment. As shown one or more inputs 800 are provided to a device manufacturing process 810 involving production substrates patterned using a lithographic apparatus. The inputs 800 may include one or more layout parameters and/or one or process parameters as described above. The device manufacturing process 810 involves at least one device production step, such as lithographic patterning, development, etch, etc. or any combination selected therefrom.

Subsequent to or during the process 810, one or more outputs 820 may be produced. The outputs 820 may include values of one or more process and/or layout parameters for production substrates produced using the device manufacturing process. For example, the values may be data of the production substrates measured by a metrology tool, may be data from a lithographic apparatus or etch tool after processing of the production substrates, etc. In an embodiment, at least some of the data may be labeled as described herein. Such outputs 820 are provided to state estimator 830 to train a model as described herein. In an embodiment, the model is used to predict defects although a model may be trained to predict other aspects. As shown, the state estimator 830 may receive one or more inputs 820 to the process 810. For example, the one or more inputs 820 may be layout data or data produced from layout data. For example, data produced from the layout data may be a simulation of a pattern layout to identify hotspots (e.g., areas of a pattern layout prone to not pattern correctly). Such simulated data may be produced using simulation software in the art such as ASML's Tachyon LMC product.

The model of the state estimator 830 may then be used to provide an output to regulator 840. Regulator 840 may provide one or more inputs 800 to the process 810 and/or modify one or more inputs 800 to be supplied to process 810. For example, the regulator 840 may generate one or more settings for a lithographic apparatus, etch tool, etc. to help mitigate defects in the future production of substrates. In an embodiment, the regulator 840 may receive one or more targets 850 that identify to what or by what standard the regulator 840 should introduce or modify one or more inputs 800 to the process 810.

Figure 9:
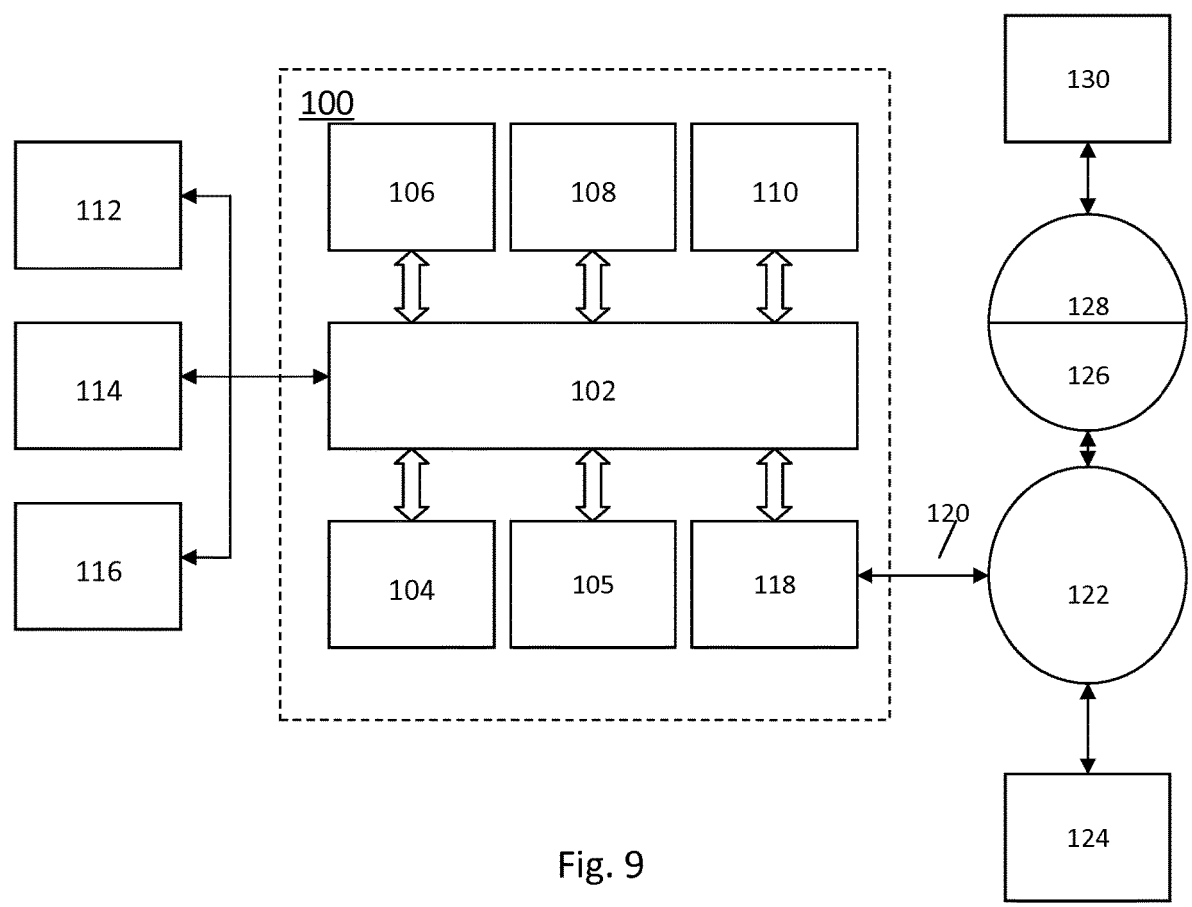
FIG. 9 is a block diagram of a model predictive control system.

FIG. 9 is a block diagram that illustrates a computer system 100 which can assist in implementing optimization methods and flows disclosed herein. Computer system 100 includes a bus 102 or other communication mechanism to communicate information, and a processor 104 (or multiple processors 104 and 105) coupled with bus 102 to process information. Computer system 100 may also include a main memory 106, such as a random access memory (RAM) or other dynamic storage device, coupled to bus 102 to store and/or supply information and instructions to be executed by processor 104. Main memory 106 may be used to store and/or supply temporary variables or other intermediate information during execution of instructions to be executed by processor 104. Computer system 100 may further include a read only memory (ROM) 108 or other static storage device coupled to bus 102 to store and/or supply static information and instructions for processor 104. A storage device 110, such as a magnetic disk or optical disk, may be provided and coupled to bus 102 to store and/or supply information and instructions.

Computer system 100 may be coupled via bus 102 to a display 112, such as a cathode ray tube (CRT) or flat panel or touch panel display, to display information to a computer user. An input device 114, including alphanumeric and other keys, may be coupled to bus 102 to communicate information and command selections to processor 104. Another type of user input device may be cursor control 116, such as a mouse, a trackball, or cursor direction keys, to communicate direction information and command selections to processor 104 and to control cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a disk or memory of a remote computer. The remote computer can load the instructions into its dynamic memory and send the instructions over a communications path. Computer system 100 can receive the data from the path and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may include a communication interface 118 coupled to bus 102. Communication interface 118 provides a two-way data communication coupling to a network link 120 that is connected to a network 122. For example, communication interface 118 may provide a wired or wireless data communication connection. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through network 122 to a host computer 124 or to data equipment operated by an Internet Service Provider (ISP) 126. ISP 126 in turn provides data communication services through the worldwide packet data communication network, now commonly referred to as the "Internet" 128. Network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, network 122 and communication interface 118. One such downloaded application may provide for the code to implement a method herein, for example. The received code may be executed by processor 104 as it is received, and/or stored in storage device 110, or other non-volatile storage for later execution. In this manner, computer system 100 may obtain application code in the form of a carrier wave.

Figure 10:
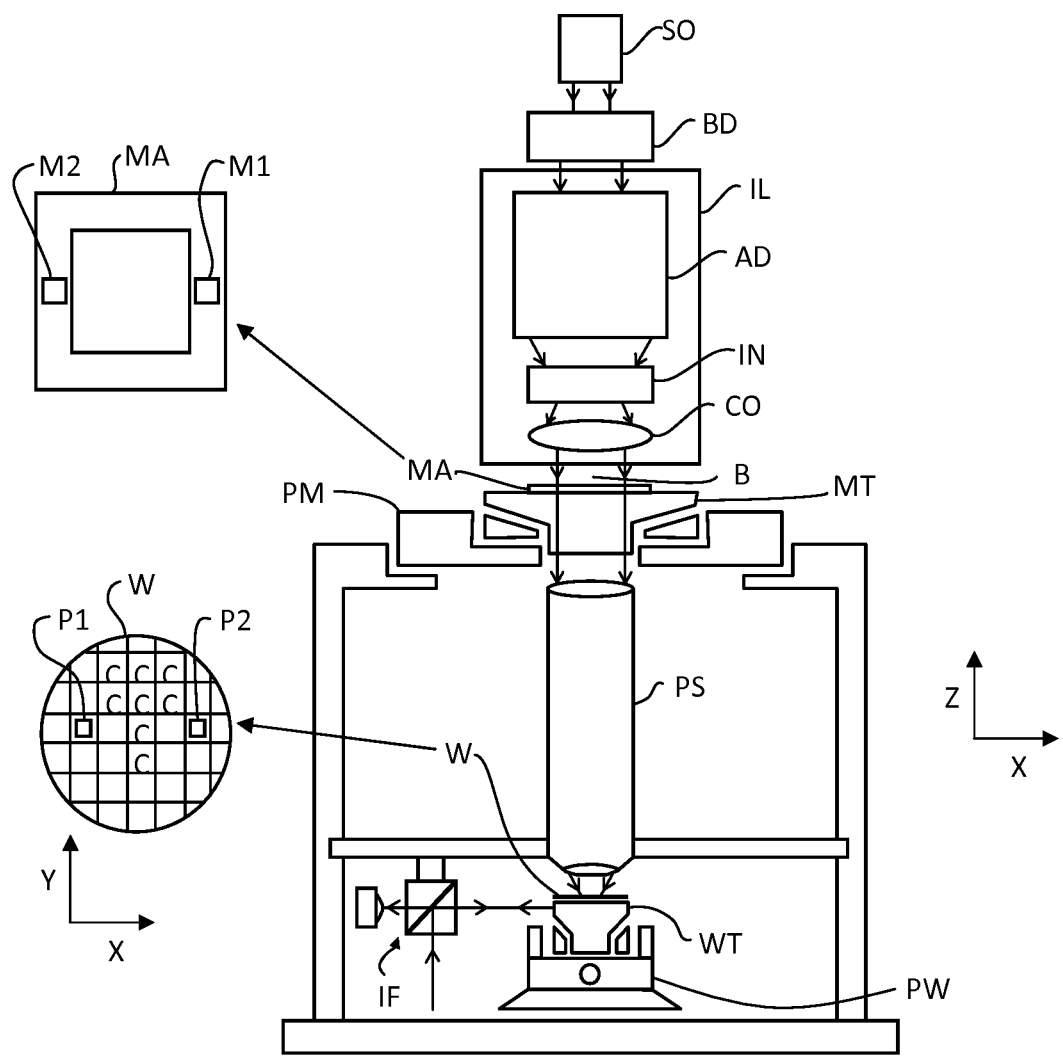
FIG. 10 is a schematic diagram of a lithographic projection apparatus.

FIG. 10 schematically depicts an exemplary lithographic projection apparatus. The apparatus comprises:
- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner PM to accurately position the patterning device with respect to item PS;
- a second object table (substrate table) WT provided with a substrate holder to hold a substrate W (e.g., a resist-coated silicon wafer), and connected to a second positioner PW to accurately position the substrate with respect to item PS;
- a projection system PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed a conditioner, such as a beam expander. The illuminator IL may comprise an adjuster AD configured to set the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 10 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors BD); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through the projection system PS, which focuses the beam B onto a target portion C of the substrate W. With the aid of the second positioner PW (and interferometer IF), the substrate table WT can be moved accurately, e.g. so as to position different target portions C in the path of the beam B. Similarly, the first positioner PM can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 10.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features.

Figure 11:
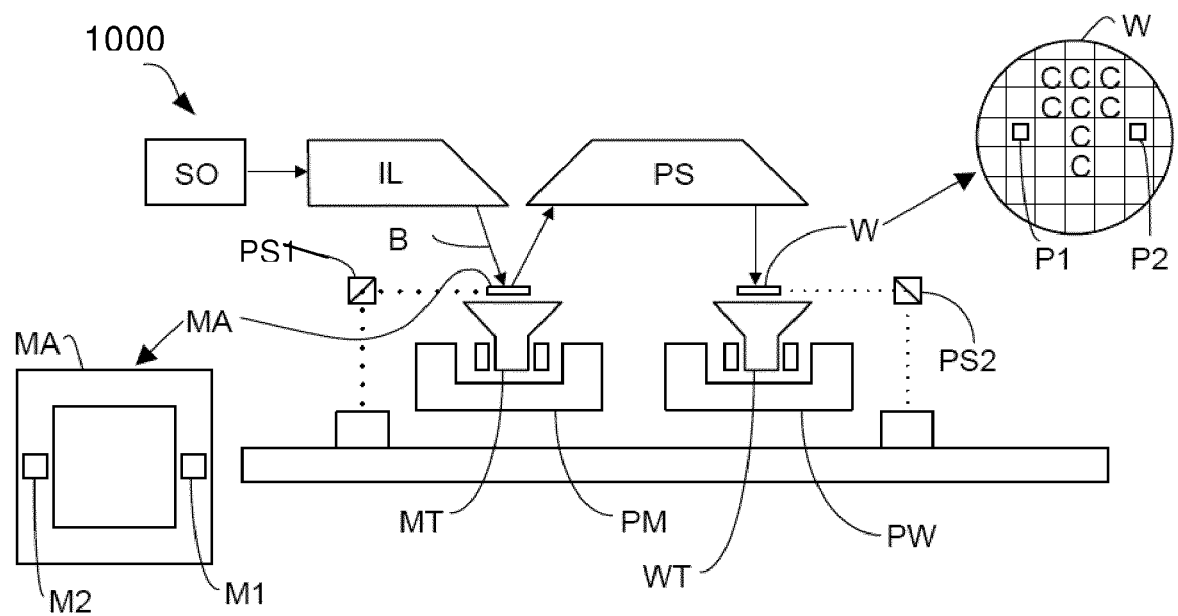
FIG. 11 is a schematic diagram of another lithographic projection apparatus.

FIG. 11 schematically depicts another exemplary lithographic projection apparatus 1000. The lithographic projection apparatus 1000 includes:
  a source collector module SO
  an illumination system (illuminator) IL configured to condition a radiation beam B (e.g. EUV radiation).
  a support structure (e.g. a mask table) MT constructed to support a patterning device (e.g. a mask or a reticle) MA and connected to a first positioner PM configured to accurately position the patterning device;
  a substrate table (e.g. a wafer table) WT constructed to hold a substrate (e.g. a resist coated wafer) W and connected to a second positioner PW configured to accurately position the substrate; and
  a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the patterning device may have a multilayer reflector comprising, for example, a multi-stack of molybdenum and silicon. In one example, the multi-stack reflector has a 40 layer pairs of molybdenum and silicon. Even smaller wavelengths may be produced with X-ray lithography. Since most material is absorptive at EUV and x-ray wavelengths, a thin piece of patterned absorbing material on the patterning device topography (e.g., a TaN absorber on top of the multilayer reflector) defines where features would print (positive resist) or not print (negative resist).

Referring to FIG. 11, the illuminator IL receives an extreme ultra violet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 11, to provide the laser beam to excite the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously in a given direction (the so-called "scan direction") while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Further, the lithographic apparatus may be of a type having two or more tables (e.g., two or more substrate table, two or more patterning device tables, and/or a substrate table and a table without a substrate). In such "multiple stage" devices the additional tables may be used in parallel, or preparatory steps may be carried out on one or more tables while one or more other tables are being used for exposures. Twin stage lithographic apparatuses are described, for example, in U.S. Pat. No. 5,969,441, incorporated herein by reference in its entirety.

Figure 12:
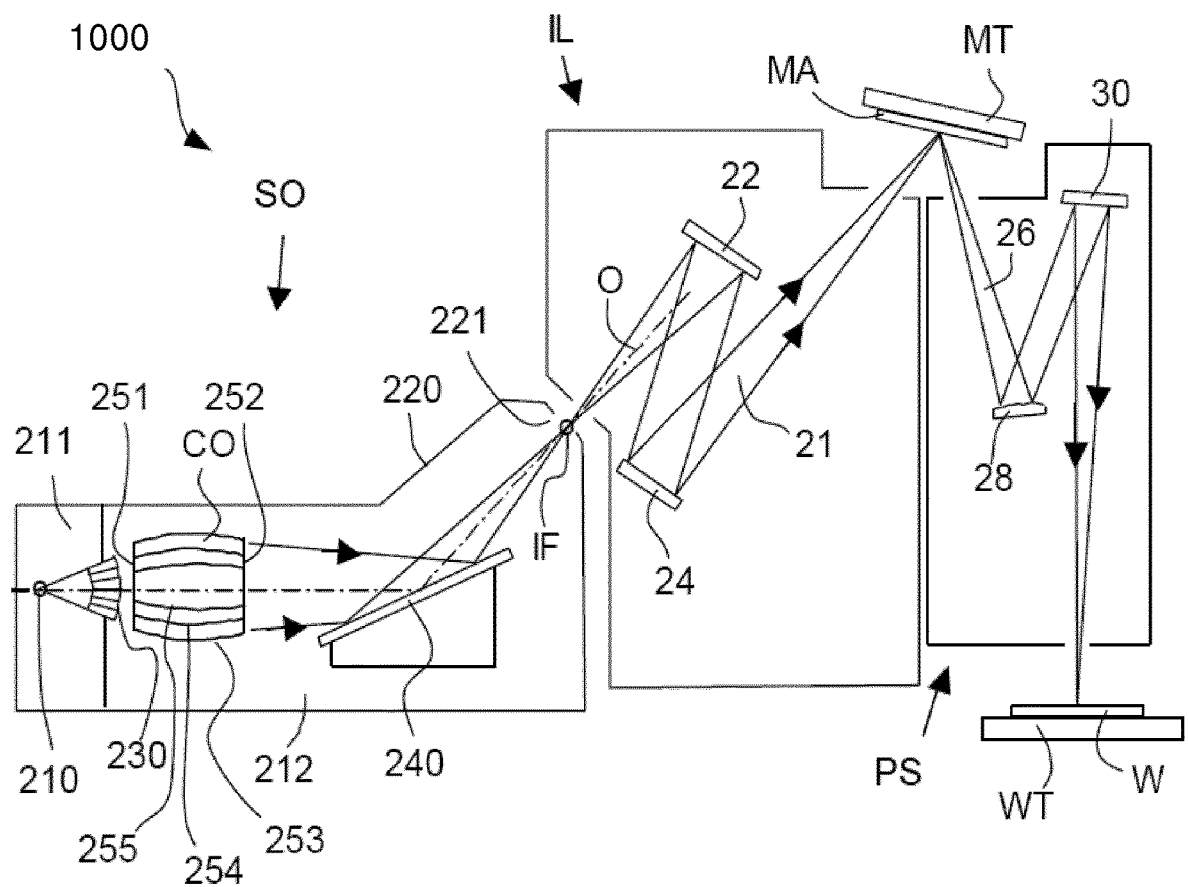
FIG. 12 is a more detailed view of the apparatus in FIG. 11.

FIG. 12 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 12.

Collector optic CO, as illustrated in FIG. 12, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma source, often called a DPP source. Alternatively, the source collector module SO may be part of an LPP radiation system.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

The concepts disclosed herein may be used to simulate or mathematically model any device manufacturing process involving a lithographic apparatus, and may be especially useful with emerging imaging technologies capable of producing wavelengths of an increasingly smaller size. Emerging technologies already in use include deep ultraviolet (DUV) lithography that is capable of producing a 193 nm wavelength with the use of an ArF laser, and even a 157 nm wavelength with the use of a fluorine laser. Moreover, EUV lithography is capable of producing wavelengths within a range of 5-20 nm.

While the concepts disclosed herein may be used for device manufacturing on a substrate such as a silicon wafer, it shall be understood that the disclosed concepts may be used with any type of lithographic imaging systems, e.g., those used for imaging on substrates other than silicon wafers.

The patterning device referred to above comprises or can form a design layout. The design layout can be generated utilizing a CAD (computer-aided design) program. This process is often referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As noted, microlithography is a significant step in the manufacturing of devices such as ICs, where patterns formed on substrates define functional elements of the ICs, such as microprocessors, memory chips etc. Similar lithographic techniques are also used in the formation of flat panel displays, micro-electro mechanical systems (MEMS) and other devices.

The process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

As an example, OPC addresses the fact that the final size and placement of an image of the design layout projected on the substrate will not be identical to, or simply depend only on the size and placement of the design layout on the patterning device. A person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

To help ensure that the projected image of the design layout is in accordance with requirements of a given target circuit design, proximity effects may be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Applying OPC is generally not an "exact science", but an empirical, iterative process that does not always compensate for all possible proximity effect. Therefore, the effect of OPC, e.g., design layouts after application of OPC and any other RET, should be verified by design inspection, i.e. intensive full-chip simulation using calibrated numerical process models, in order to minimize the possibility of design flaws being built into the patterning device pattern. Both OPC and full-chip RET verification may be based on numerical modeling systems and methods as described, for example in, U.S. Patent Application Publication No. US 2005-0076322 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. As is known, off-axis illumination, such as annular, quadrupole, and dipole, is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for the process window. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations.

For low $k_1$ photolithography, optimization of both the source and patterning device is useful to ensure a viable process window for projection of critical circuit patterns. Some algorithms discretize illumination into independent source points and the patterning device pattern into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of an apparatus or a device manufacturing process, for example, parameters a user of the lithographic apparatus can adjust, or image characteristics a user can adjust by adjusting those parameters. It should be appreciated that any characteristics of a device manufacturing process, including those of the source, the patterning device, the projection optics, and/or resist characteristics can be among the design variables in the optimization. The cost function is often a non-linear function of the design variables. Then standard optimization techniques are used to minimize the cost function.

A source and patterning device (design layout) optimization method and system that allows for simultaneous optimization of the source and patterning device using a cost function without constraints and within a practicable amount of time is described in a commonly assigned PCT Patent Application Publication No. WO2010/059954, which is hereby incorporated by reference in its entirety.

Another source and mask optimization method and system that involves optimizing the source by adjusting pixels of the source is described in U.S. Patent Application Publication No. 2010/0315614, which is hereby incorporated by reference in its entirety.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. Thus, a lithographic apparatus using the imprint technology typically include a template holder to hold an imprint template, a substrate table to hold a substrate and one or more actuators to cause relative movement between the substrate and the imprint template so that the pattern of the imprint template can be imprinted onto a layer of the substrate.

The invention may further be described using the following clauses:

1. A computer-implemented defect prediction method for a device manufacturing process involving production substrates processed by a lithographic apparatus, the method comprising:

training a classification model using a training set comprising measured or determined values of a process parameter associated with the production substrates processed by the device manufacturing process and an indication regarding existence of defects associated with the production substrates processed in the device manufacturing process under the values of the process parameter; and producing an output from the classification model that indicates a prediction of a defect for a substrate.

2. The method of clause 1, comprising training the classification model using a further training set comprising further measured or determined values of a process parameter associated with production substrates processed by the device manufacturing process and an indication regarding existence of defects associated with the production substrates processed in the device manufacturing process under the further values of the process parameter.

3. The method of clause 2, wherein at least some of the further values are generated after training the classification model using the measured or determined values.

4. The method of clause 2 or clause 3, wherein the further training set comprises at least a portion of the measured or determined values in addition to the further values.

5. The method of any of clauses 1 to 4, further comprising repeatedly performing the training based on further measured or determined values of the process parameter associated with further production substrates processed by the device manufacturing process.

6. The method of any of clauses 1 to 5, further comprising calculating a probability of the defect for the substrate using the classification model.

7. The method of clause 6, further comprising adjusting a parameter of the device manufacturing process, a parameter of a layout to be patterned onto a substrate, or both, using the probability.

8. The method of any of clauses 1 to 7, wherein the indication regarding existence of the defect comprises a determination by an optical measuring tool or operator input or determined from yield data or electronic testing data.

9. The method of any of clauses 1 to 8, wherein the indication regarding existence of the defect comprises a determination by an empirical or computational model.

10. The method of any of clauses 1 to 9, wherein the indication regarding existence of the defect comprises determination by a user of the lithographic apparatus.

11. The method of any of clauses 1 to 10, wherein the indication regarding existence of the defect comprises a determination after patterning a layout on each die of a substrate or each substrate.

12. The method of any of clauses 1 to 11, wherein the classification model involves logistic regression, kernel logistic regression, support vector machine or import vector machine.

13. The method of any of clauses 1 to 12, wherein a number of categories of the classification model is two.

14. The method of clause 13, wherein the categories comprise existence of defects and nonexistence of defects.

15. The method of any of clauses 1 to 14, wherein the defects are one or more selected from a group consisting of necking, line pull back, line thinning, CD, overlapping and bridging.

16. The method of any of clauses 1 to 15, wherein the parameter of the device manufacturing process is one or more selected from a group consisting of a characteristic of a radiation source of the lithographic apparatus, a characteristic of projection optics of the lithographic apparatus, dose, focus, a characteristic of a resist, a characteristic of development of the resist, a characteristic of post-exposure baking of the resist, and a characteristic of etching of a substrate.

17. The method of any of clauses 1 to 16, further comprising training the classification model using values of a process parameter simulated using a parameter of a layout to be patterned on a substrate and an indication regarding existence of defects associated with the simulated values of the process parameter.

18. The method of any of clauses 1 to 17, further comprising training the classification model using values of the process parameter measured by a metrology tool.

19. The method of any of clauses 1 to 18, further comprising determining the indication regarding existence of the defects associated with the values of the process parameter.

20. The method of any of clauses 1 to 19, further comprising measuring or determining the values of the process parameter, the values being one or more selected from: measured values from a metrology tool, yield data, or values from a lithographic apparatus.

21. The method of any of clauses 1 to 20, wherein the device manufacturing process is an etch process.

22. The method of any of clauses 1 to 20, wherein the device manufacturing comprises a lithographic patterning process.

23. A method of training a classification model, the method comprising:
predicting a defect in or on a substrate using the classification model, the classification model having, as an independent variable, a process parameter of a device manufacturing process for lithographically exposed substrates and/or a layout parameter of a pattern to be provided on a substrate using a lithographic apparatus;
receiving information regarding existence of a defect for a measured or determined value of the process parameter and/or layout parameter; and
training the classification model based on the predicted defect and the information regarding existence of the defect for the measured or determined value of the process parameter and/or layout parameter.

24. The method of clause 23, wherein the information regarding existence of the defect comprises a plurality of values of the process parameter of the device manufacturing process measured by an optical measuring tool.

25. The method of clause 23 or clause 24, further comprising repeating the predicting, receiving and training based on data measured during the device manufacturing process from a plurality of substrates processed by the device manufacturing process.

26. The method of any of clauses 23 to 25, further comprising adjusting a parameter of the device manufacturing process, a parameter of a layout to be patterned onto a substrate, or both, using an output of the classification model.

27. The method of any of clauses 23 to 26, wherein the classification model involves logistic regression, kernel logistic regression, support vector machine or import vector machine.

28. A computer-implemented method of producing a classification model to facilitate defect prediction in a device manufacturing process involving production substrates processed by a lithographic apparatus, the method comprising training the classification model using a training set comprising measured or determined values of a process parameter of a plurality of substrates processed by the device manufacturing process and an indication regarding existence of defects associated with the values of the process parameter.

29. The method of clause 28, further comprising predicting a defect in a substrate using the classification model.

30. The method of clause 29, further comprising providing an estimate of the probability of the defect.

31. A computer program product comprising a computer readable medium having instructions recorded thereon, the instructions when executed by a computer implementing the method of any of the above clauses.

The descriptions above are intended to be illustrative, not limiting. Thus, it will be apparent to one skilled in the art that modifications may be made as described without departing from the scope of the claims set out below.

What is claimed is:

1. A defect prediction method for a device manufacturing process involving production substrates processed by a lithographic apparatus, the method comprising:
training, by a hardware computer system, a classification model using a training set comprising measured or determined values of a process parameter associated with the production substrates processed by the device manufacturing process and an indication regarding existence of defects associated with the production substrates processed in the device manufacturing process under the values of the process parameter, the process parameter representing a setting or condition of a physical process, a material, an object or an apparatus that occurred during, or is occurring during, application of physical processing to the production substrates; and
producing, by the hardware computer system, an output from the classification model that indicates a prediction of a defect for a substrate.

2. The method of claim 1, comprising training the classification model using a further training set comprising further measured or determined values of a process parameter associated with production substrates processed by the device manufacturing process and an indication regarding existence of defects associated with the production substrates processed in the device manufacturing process under the further values of the process parameter.

3. The method of claim 2, wherein at least some of the further values are generated after training the classification model using the measured or determined values.

4. The method of claim 2, wherein the further training set comprises at least a portion of the measured or determined values in addition to the further values.

5. The method of claim 1, further comprising repeatedly performing the training based on further measured or determined values of the process parameter associated with further production substrates processed by the device manufacturing process.

6. The method of claim 1, further comprising calculating a probability of the defect for the substrate using the classification model.

7. The method of claim 6, further comprising adjusting a parameter of the device manufacturing process, a parameter of a layout to be patterned onto a substrate, or both, using the probability.

8. The method of claim 1, wherein the indication regarding existence of the defect comprises a determination by an optical measuring tool or operator input or is determined from yield data or electronic testing data.

9. The method of claim 1, wherein the indication regarding existence of the defect comprises a determination by an empirical or computational model, or determination by a user of the lithographic apparatus, or a determination after patterning a layout on each die of a substrate or each substrate.

10. The method of claim 1, wherein the classification model involves logistic regression, kernel logistic regression, support vector machine or import vector machine.

11. The method of claim 1, wherein a number of categories of the classification model is two.

12. The method of claim 11, wherein the categories comprise existence of defects and nonexistence of defects.

13. The method of claim 1, wherein the defects are one or more selected from a group consisting of necking, line pull back, line thinning, critical dimension, overlapping and bridging.

14. The method of claim 1, wherein the process parameter is a characteristic of illumination by the lithographic apparatus, a, characteristic of projection optics of the lithographic apparatus, dose, focus, a characteristic of resist, a characteristic of development of resist, a characteristic of post-exposure baking of resist, and/or a characteristic of etching.

15. A method of training a classification model, the method comprising:
    predicting, by a hardware computer system, a defect in or on a substrate using the classification model, the classification model having, as an independent variable, a process parameter of a device manufacturing process for lithographically exposing substrates and/or a layout parameter of a pattern to be provided on a substrate using a lithographic apparatus, the process parameter representing a setting or condition of a physical process, a material, an object or an apparatus that occurred during, or is occurring during, application of physical processing to production substrates;
    receiving information regarding existence of a defect for a measured or determined value of the process parameter and/or layout parameter; and
    training, by a hardware computer system, the classification model based on the predicted defect and the information regarding existence of the defect for the measured or determined value of the process parameter and/or layout parameter.

16. A method of producing a classification model to facilitate defect prediction in a device manufacturing process involving production substrates processed by a lithographic apparatus, the method comprising training, by a hardware computer system, the classification model using a training set comprising measured or determined values of a process parameter of a plurality of substrates processed by the device manufacturing process and an indication regarding existence of defects associated with the values of the process parameter, the process parameter representing a setting or condition of a physical process, a material, an object or an apparatus that occurred during, or is occurring during, application of physical processing to production substrates.

17. The method of claim 16, further comprising predicting a defect in a substrate using the classification model.

18. The method of claim 17, further comprising providing an estimate of the probability of the defect.

19. The method of claim 16, wherein the process parameter is a characteristic of illumination by the lithographic apparatus, a characteristic of projection optics of the lithographic apparatus, dose, focus, a characteristic of resist, a characteristic of development of resist, a characteristic of post-exposure baking of resist, and/or a characteristic of etching.

20. The method of claim 15, wherein the information regarding existence of the defect comprises a plurality of values of the process parameter of the device manufacturing process measured by an optical measuring tool.

21. The method of claim 15, further comprising repeating the predicting, receiving and training based on data measured during the device manufacturing process from a plurality of substrates processed by the device manufacturing process.

22. The method of claim 15, further comprising adjusting a parameter of the device manufacturing process, a parameter of a layout to be patterned onto a substrate, or both, using an output of the classification model.

23. The method of claim 15, wherein the process parameter is a characteristic of illumination by the lithographic apparatus, a characteristic of projection optics of the lithographic apparatus, dose, focus, a characteristic of resist, a characteristic of development of resist, a characteristic of post-exposure baking of resist, and/or a characteristic of etching.

24. A non-transitory computer-readable medium comprising instructions therein, the instructions, when executed, configured to cause a computer apparatus to at least:
    train a classification model using a training set comprising measured or determined values of a process parameter associated with production substrates processed by the device manufacturing process and an indication regarding existence of defects associated with the production substrates processed under the values of the process parameter in a device manufacturing process involving production substrates processed by a lithographic apparatus, the process parameter representing a setting or condition of a physical process, a material, an object or an apparatus that occurred during, or is occurring during, application of physical processing to the production substrates; and
    produce an output from the classification model that indicates a prediction of a defect for a substrate.

25. A non-transitory computer-readable medium comprising instructions therein, the instructions, when executed, configured to cause a computer apparatus to at least:
- predict a defect in or on a substrate using a classification model, the classification model having, as an independent variable, a process parameter of a device manufacturing process for lithographically exposing substrates and/or a layout parameter of a pattern to be provided on a substrate using a lithographic apparatus, the process parameter representing a setting or condition of a physical process, a material, an object or an apparatus that occurred during, or is occurring, during application of physical processing to production substrates;
- receive information regarding existence of a defect for a measured or determined value of the process parameter and/or layout parameter; and
- train the classification model based on the predicted defect and the information regarding existence of the defect for the measured or determined value of the process parameter and/or layout parameter.

26. A non-transitory computer-readable medium comprising instructions therein, the instructions, when executed, configured to cause a computer apparatus to at least:
- train a classification model to facilitate defect prediction in a device manufacturing process involving production substrates processed by a lithographic apparatus, using a training set comprising measured or determined values of a process parameter of a plurality of substrates processed by the device manufacturing process and an indication regarding existence of defects associated with the values of the process parameter, the process parameter representing a setting or condition of a physical process, a material, an object or an apparatus that occurred during, or is occurring during, application of physical processing to the production substrates.

* * * * *